(12) United States Patent
Baret et al.

(10) Patent No.: US 7,663,055 B2
(45) Date of Patent: Feb. 16, 2010

(54) PHOTOVOLTAIC MODULE COMPRISING EXTERNAL CONNECTOR PINS

(75) Inventors: Guy Baret, Voiron (FR); Hubert Lauvray, Saint Clair du Rhône (FR)

(73) Assignee: Apollon Solar, Paris (FR)

( * ) Notice: Subject to any disclaimer, the term of this patent is extended or adjusted under 35 U.S.C. 154(b) by 580 days.

(21) Appl. No.: 10/542,146

(22) PCT Filed: Jan. 19, 2004

(86) PCT No.: PCT/FR2004/000108

§ 371 (c)(1),
(2), (4) Date: Jul. 13, 2005

(87) PCT Pub. No.: WO2004/075246

PCT Pub. Date: Sep. 2, 2004

(65) Prior Publication Data

US 2006/0054213 A1    Mar. 16, 2006

(30) Foreign Application Priority Data

Jan. 24, 2003    (FR) .................................. 03 00797

(51) Int. Cl.
*H02N 6/00* (2006.01)
(52) U.S. Cl. ...................... 136/251; 52/173.3; 257/433; 136/243
(58) Field of Classification Search ................ 136/251, 136/243; 57/173.3; 257/433
See application file for complete search history.

(56) References Cited

U.S. PATENT DOCUMENTS

| 3,688,248 | A | * | 8/1972 | Modrey ...................... 439/787 |
| 3,721,948 | A | * | 3/1973 | Brandt et al. ................ 439/695 |
| 4,210,462 | A | * | 7/1980 | Tourneux .................... 136/251 |
| 4,880,401 | A | * | 11/1989 | Shima et al. ................. 439/746 |
| 5,961,740 | A | * | 10/1999 | Wambach et al. ........... 136/251 |
| 6,066,796 | A | * | 5/2000 | Itoyama et al. .............. 136/251 |
| 6,075,201 | A |   | 6/2000 | Wambach |
| 6,111,772 | A | * | 8/2000 | Lee et al. ..................... 363/146 |
| 6,337,436 | B1 | * | 1/2002 | Ganz ........................... 136/251 |
| 6,494,995 | B1 | * | 12/2002 | Battah ......................... 202/234 |
| 6,582,249 | B1 | * | 6/2003 | Boeck et al. ................. 439/492 |
| 6,676,459 | B2 | * | 1/2004 | Mukai et al. ................ 439/884 |

(Continued)

FOREIGN PATENT DOCUMENTS

DE    296 07 069 U1    8/1996

(Continued)

*Primary Examiner*—Jennifer K Michener
*Assistant Examiner*—Xiuyu Tai
(74) *Attorney, Agent, or Firm*—Oliff & Berridge, PLC

(57) ABSTRACT

The photovoltaic module comprises a plurality of photovoltaic cells arranged between substrates and connected in series by connecting conductors. An external connector pin of the module comprises a block of insulating material glued to one end of the module. An external connector of the pin is connected to at least one connector electrically connected to the connecting conductor associated with a cell arranged at the end of the module. The contact between the connector and the connecting conductor associated with a cell arranged at the end of the module is achieved by pressure, generated by means of a deformation. The deformation can be achieved either at the free end of the connecting conductor or at the internal end of the connector.

11 Claims, 3 Drawing Sheets

U.S. PATENT DOCUMENTS

2003/0116185 A1 * 6/2003 Oswald .................. 136/251

FOREIGN PATENT DOCUMENTS

| | | |
|---|---|---|
| EP | 0 798 787 A2 | 10/1997 |
| FR | 2 362 494 A | 3/1978 |
| FR | 2 469 806 A | 5/1981 |
| JP | A 58-043580 | 3/1983 |
| WO | WO 00/46860 A1 | 8/2000 |

* cited by examiner

PHOTOVOLTAIC MODULE COMPRISING EXTERNAL CONNECTOR PINS

BACKGROUND OF THE INVENTION

The invention relates to a photovoltaic module comprising a plurality of photovoltaic cells arranged between substrates and connected in series by connecting conductors, and an external connector pin of the module, comprising a block of insulating material fixed to one end of the module so as to connect to an external connector at least one connector electrically connected to the connecting conductor associated with a cell arranged at the end of the module.

STATE OF THE ART

A photovoltaic cell is conventionally formed on a bulk silicon substrate cut into wafers having a thickness of a few hundred microns. The substrate can be made from monocrystalline silicon, polycrystalline silicon or semi-conducting layers deposited on a glass or ceramic substrate. It has on its surface an array of narrow electrodes generally made of silver or aluminium designed to drain the current to one or more main electrodes having a width of 1 to a few millimeters, also made of silver or aluminium.

Each cell supplies a current dependent on the lighting in an electric voltage which depends on the nature of the semiconductor and which is usually about 0.45V to 0.65V for crystalline silicon. As voltages of 6V to several tens of volts are usually necessary to make electrical apparatuses work, a photovoltaic module is generally formed by an assembly of several cells in series. A module of 40 cells supplies for example close to 24 volts. Depending on the currents required, several cells can also be placed in parallel. A generator can then be achieved by adding possibly thereto storage batteries, a voltage regulator, etc.

To achieve a photovoltaic module, the cells are prepared, i.e. covered with an array of electrodes and connected to one another by metal conductors. The assembly thus formed is then placed between two sheets of polymer themselves pressed between two glass substrates. The assembly is then heated to about 120° C. to soften the polymer greatly, to make it transparent and achieve mechanical cohesion of the module.

In a known photovoltaic cell 1, represented in FIG. 1, rear connecting conductors 5' associated with a first cell 2a are connected to the front connecting conductors 5 associated with an adjacent second cell 2b. If the module comprises more than two cells, the rear connecting conductors of the second cell are then connected to the front connecting conductors of the next cell, all the cells in this way being connected in series. In practice, a rear connecting conductor 5' of one cell and the associated front connecting conductor 5 of the next cell can be formed by one and the same conductor. The conductors (5 and 5') and the cells 2 can be surrounded by a layer of polymer material 6 arranged between a front glass substrate 3 and a rear glass substrate 4. The end of a connecting conductor (5 and 5') of an end cell is salient outwards from the module 1 and forms an external connector 7. Such connectors become damaged and oxidize with time. The degradation is all the greater the larger the module and the greater the current and voltage supplied by the module.

The document U.S. Pat. No. 6,075,201 describes a photovoltaic module comprising a plurality of photovoltaic cells arranged between substrates and connected to one another by connecting conductors. The connecting conductor of a cell arranged at the end of the module is connected to an external connector. In the document EP 0,798,787, a connector is fixed to the end of a photovoltaic module by means of a sealing paste. These connectors are complex.

OBJECT OF THE INVENTION

The object of the invention is to remedy these shortcomings and, in particular, to provide a connection of a photovoltaic module minimizing the problems of degradation and oxidation of connectors connecting the module with the outside.

According to the invention, this object is achieved by a photovoltaic module according to the accompanying claims. In particular, as the block of insulating material is glued to the end of the module, the contact between an internal end of the connector and a free end of the connecting conductor associated with a cell arranged at the end of the module is achieved by pressure generated by means of a deformation. The deformation can be achieved either at the free end of the connecting conductor or at the internal end of the connector.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 1:
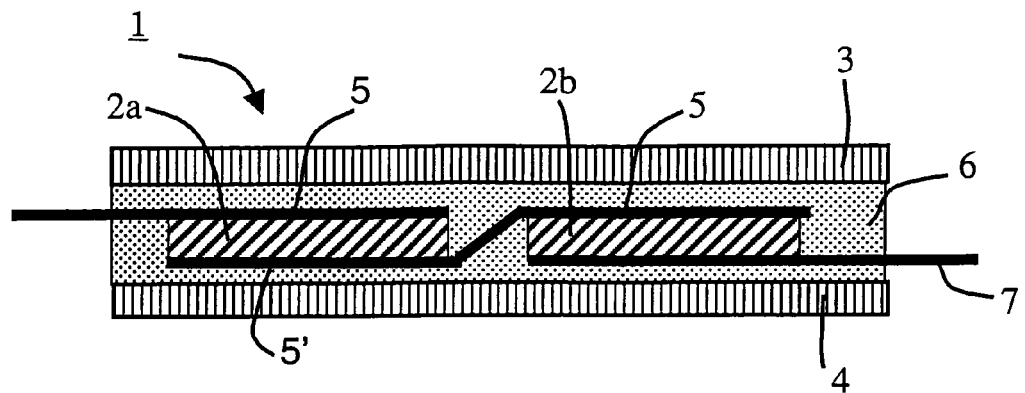
FIG. 1 is a photovoltaic module according to the prior art.

The photovoltaic module 1 comprises metal connectors 11 designed to enable external connection of the module 1. FIGS. 2 to 8 represent various embodiments of external connector pins 13 of the module each comprising a block of insulating material 15 glued to the end of the module 1 so as to connect external connectors to the connectors 11. In a preferred embodiment, the connectors 11 pass tightly through a seal 12, represented in FIGS. 2 to 5 and 8, which can be arranged between the two substrates 3 and 4, for example made of glass, so as to define a tight internal volume, inside the module 1, wherein the cells 2 are arranged. A negative pressure is preferably formed inside the tight internal volume by any suitable means. The seal 12 can be a seal made of organic material or of mineral material. In the latter case, the assembly can be annealed at a much higher temperature than the ambient temperature, for example between 180° C. and 500° C., in order to perform sealing and the negative pressure forms automatically when cooling of the module is performed. This negative pressure enables welds between the connecting conductors 5 and cells 2 to be eliminated.

Figure 2:
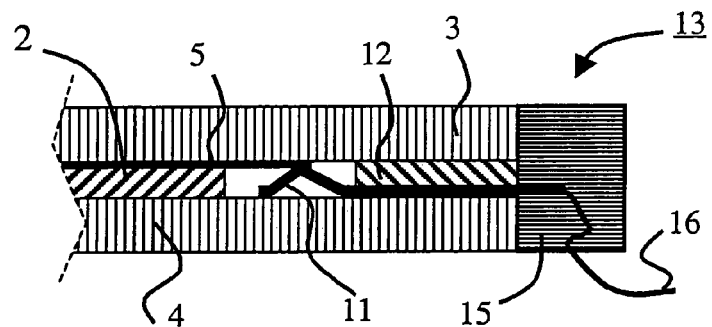
FIGS. 2 to 4 and 8 represent different particular embodiments of external connector pins of the module according to the invention.

The contact between the connector 11 and the connecting conductor 5 associated with a cell 2b arranged at the end of the module 1 is ensured by pressure generated by a deformation. In a first embodiment, it is then internal end of the connector 11 that is deformed, as represented in FIG. 2. Contact is thus ensured without requiring welding. The connector 11 and/or connecting conductor 5 associated with a cell 2b arranged at the end of the module 1 are, for example, made of tin-plated copper, stainless steel, titanium, copper-nickel alloy, or, preferably, a beryllium-based alloy. The elasticity of the latter alloy enables the contact spring effect and, consequently, the contact conductance to be enhanced, in spite of possible variations of thickness which may be due to expansions of the module. Iron-nickel alloys are advantageous for their thermal expansion coefficient close to that of glass.

Figure 3:
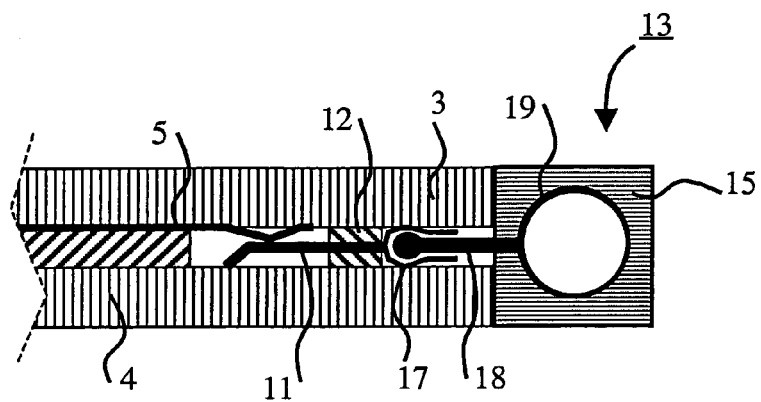
Figure 4:
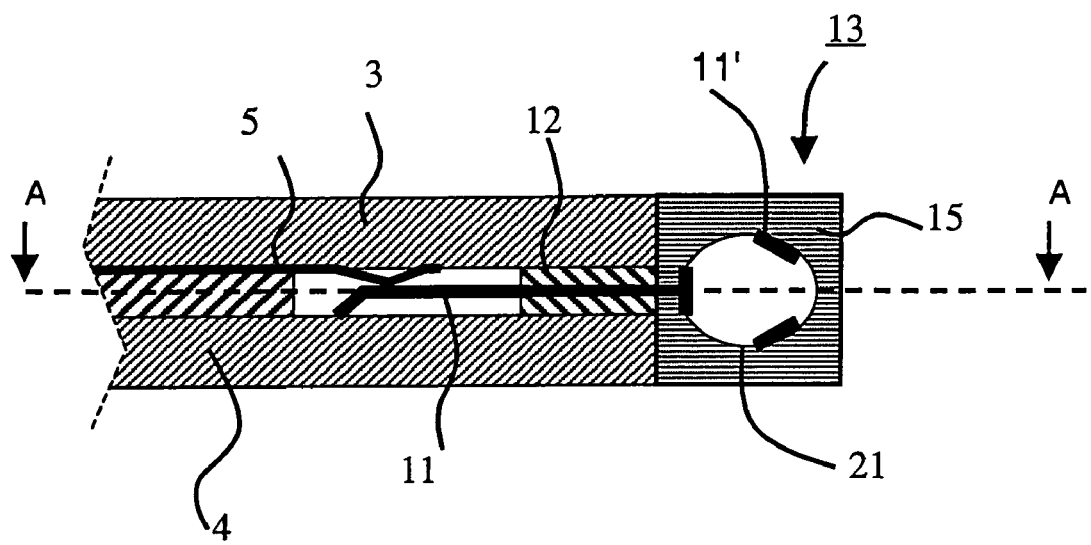
Figure 8:
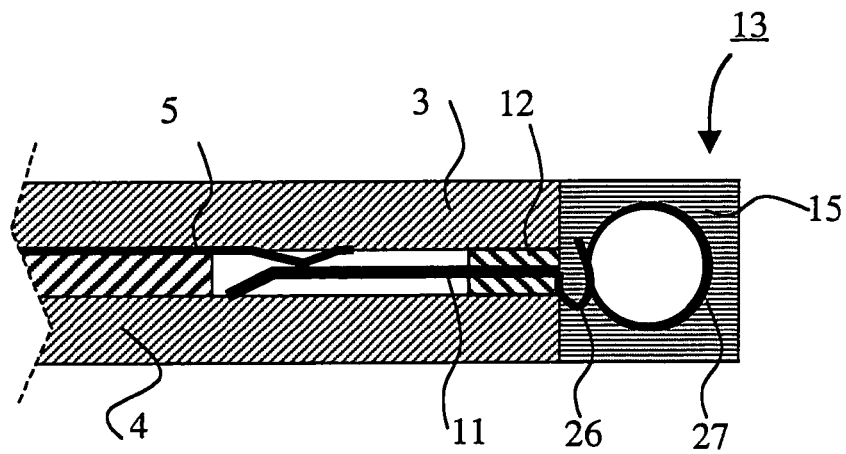

In a preferred embodiment, as represented in FIGS. 3, 4 and 8, the connector 11 is electrically connected to a connecting conductor 5 associated with the cell 2 arranged at the end of the module 1 by deformation of the free end of the connecting conductor 5 which thus exerts a pressure against the connector 11 to achieve contact, even in the absence of welding. The deformed end or the connector 11 can be tin-plated beforehand of required. Alternatively, a welding material formed by a small quantity of tin-plating paste can perform welding thereof when sealing is performed.

In FIG. 2, an external connector formed by a conducting wire 16 is connected in the block of insulating material 15, at one end of a connector 11 entering the block of insulating material 15. The insulating material can be a polymer material. The connector 11 can be a blade with a thickness comprised between 50 and 500 µm, typically 300 µm, and a width comprised between 1 and 100 mm, typically 4 mm. The connector 11 passes tightly through the seal 12 and is connected on the one hand to the connecting conductor 5 inside the module and on the other hand to the conducting wire 16 outside the module. The connection zone between the connector 11 and the conducting wire 16 is covered with a resin or a polymer, for example of epoxy type, forming the block 15 which is glued to the substrates 3 and 4. This resin or polymer can be molded. The advantages are the absence of non-welded contacts, the absence of mechanical stress during fabrication of the module and during subsequent connection thereof, and a great simplicity of the process due to the fact that welding between the connector 11 and conducting wire 16 can be performed when the module sealing operation is performed. Moreover, module protection diodes can be located outside the module (on the conducting wire 16), which makes for easy maintenance.

The connectors 11 are preferably made of a material chosen from the group comprising copper, stainless steel, titanium and iron-nickel alloys, in particular of iron-nickel alloy comprising 48% nickel (FeNi-48). In preferred manner, the material of the connectors 11 is a metal or alloy the thermal expansion coefficient whereof is close to that of the substrates, such as FeNi-48. The connectors can also be tin-plated, gold-plated or nickel-plated.

The connector 11 represented in FIG. 3 is terminated by a female part 17 of a flat connector arranged between the substrates 3 and 4 outside the tight volume. An external connector is connected to the connector 11 by a pin forming the male part 18 of the flat connector and terminated by a female part 19 integrated in an opening of the block 15. The seal 12 is arranged at a certain distance from the end of the module, corresponding to the length of the male part 18 of the flat connector salient from the block 15. The female part 19 is designed to be connected to an additional male connector inserted in an opening of the block 15. As before, the connector 11 can be formed by a blade having a thickness comprised between 50 and 500 µm, typically 300 µm, and a width comprised between 1 and 100 mm, typically 4 mm. The blade is terminated, at one end, by the female part 17. The block of insulating material 15 is preferably made of polymer or resin. A block of insulating material 15 can group several connectors 11, the female part 19 serving the purpose of connecting the connectors 11 corresponding to an external male connector inserted in a common opening of the block 15.

In an alternative embodiment (not shown), the seal 12 is arranged at the end of the module and the female parts 17 of the connectors 11 are arranged at the end of the substrates 3 and 4 outside the tight volume. The female parts 17 and male parts 18 can then have larger dimensions.

Figure 5:
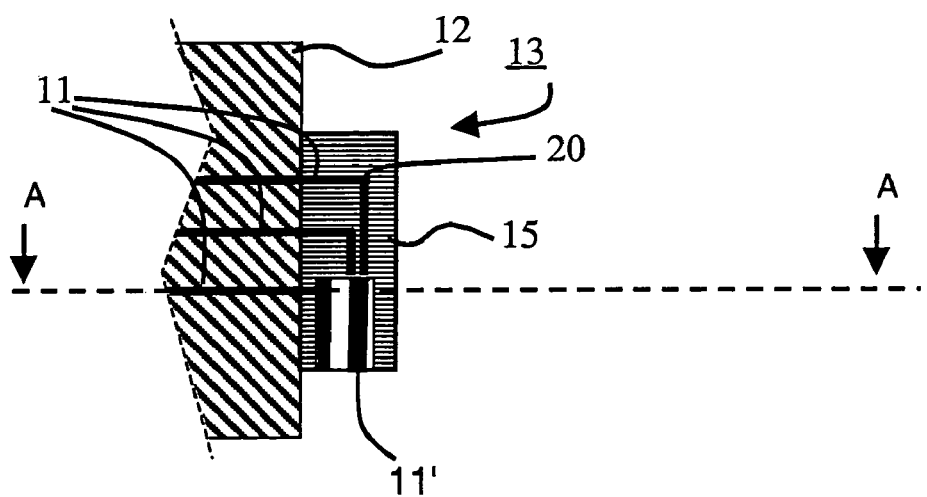
FIG. 5 represents a cross-sectional view along the line AA of FIG. 4.

In another particular embodiment represented in FIGS. 4 and 5, at least one substantially L-shaped connector 11 enters the block of insulating material 15, forming a right angle 20. Ends 11' of the connectors 11 are arranged on the wall of a cylindrical opening 21 of the pin 13. This cylindrical opening forms a female part, with the ends 11', designed to operate in conjunction with an external connector inserted in the opening. The block of insulating material 15 is preferably made of glass and sealed to the substrates 3 and 4. The pin 13 can be achieved by high temperature molding of a vitreous component around the ends of the connectors 11. The external connector 13 is then placed at the periphery of the substrates 3 and 4 when the module assembly operation is performed and welded to the substrates 3 and 4 by means of a sealing glass, for example identical to the material constituting the seal 12.

Figure 6:
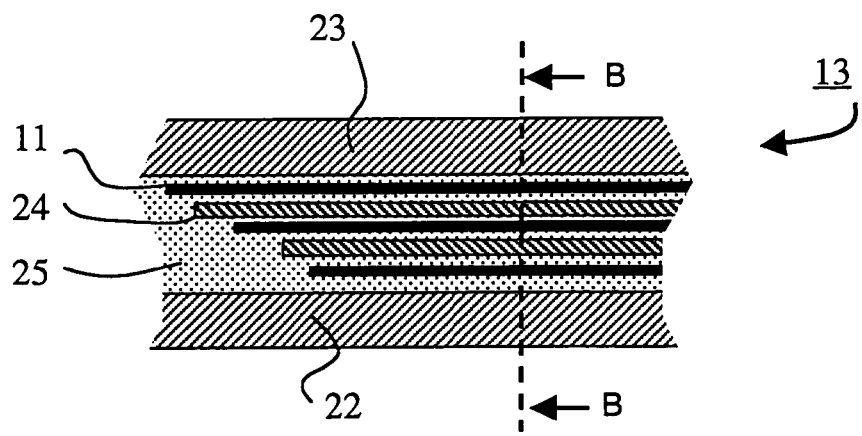
FIGS. 6 and 7 represent a particular embodiment of an external connector pin of the module, FIG. 7 being a cross-sectional view along the line BB of FIG. 6.
Figure 7:
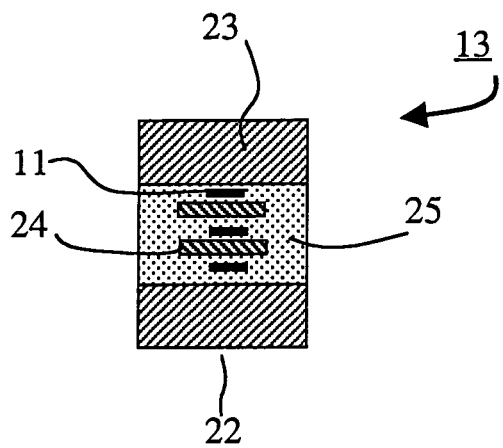

A particular alternative embodiment of the pin 13 of FIGS. 4 and 5 is represented in FIGS. 6 and 7. The block of insulating material 15 of the pin 13 comprises two glass substrates 22 and 23 surrounding several connectors 11 separated by the glass blades 24, the assembly being bonded by a sealing glass 25. The glass blades typically have a thickness comprised between 0.1 mm and 0.5 mm.

In FIG. 8, the connector 11 is terminated at the external end thereof by a flexible part 26, acting as a spring, integrated in the block of insulating material 15 and coming into contact with a contact zone 27 arranged at the periphery of an opening of the block 15 and designed to be connected to an external male connector inserted in the opening. The flexible part 26 and connector 11 can be gold-plated. The block of insulating material 15 can be made of polymer or resin and glued against the substrates 3 and 4. Several springs 26 can be connected to a common pin 13 comprising a single opening.

The external connecting means of the photovoltaic module described above are suitable for modules supplying a current comprised between 1 A and 10 A and a voltage comprised between 1V and 60V.

The invention is not limited to the particular embodiments represented. In particular, the connectors 11 can be connected to the connecting conductors 5 of any type of photovoltaic module. The connecting conductors 5 can, in particular, be arranged either on each side of a cell or on the same side of the cell, more particularly on the rear face of the cell in the case where the positive and negative poles of a cell are located on the rear face of the latter. One of the substrates can be made of metal or plastic material.

The invention claimed is:

1. A photovoltaic module comprising:
   first and second substrates separated by a peripheral seal, the first and second substrates and the peripheral seal defining an internal volume;
   a photovoltaic cell within the internal volume;
   a connecting conductor within the internal volume, the connecting conductor having one end connected to the photovoltaic cell and a free end resting on the first substrate;
   a blade conductor passing through the seal, the blade conductor having an internal end within the internal volume, resting on the second substrate and in weldless contact with the free end of the connecting conductor, the weldless contact being established between (1) an angled portion of one of the connecting conductor and the blade conductor and (2) the other of the connecting conductor and the blade conductor; and an external connector terminal comprising insulating material glued to one end of the module and embedding an external connector connected to the blade conductor, wherein the internal volume is at a negative pressure with respect to an ambient pressure, promoting the contact between the internal end of the blade conductor and the free end of the connecting conductor.

2. The photovoltaic module according to claim 1, wherein the free end of the connecting conductor comprises the angled portion.

3. The photovoltaic module according to claim 1, wherein the internal end of the blade conductor comprises angled portion.

4. The photovoltaic module according to claim 1, wherein the blade conductor is made of a material chosen from the group comprising tin-plated copper, stainless steel, titanium, iron-nickel alloys, copper-nickel alloys and beryllium-based alloys.

5. The photovoltaic module according to claim 1, wherein the connecting conductor is made of a material chosen from the group comprising tin-plated copper, stainless steel, titanium, iron-nickel alloys, copper-nickel alloys and beryllium-based alloys.

6. The photovoltaic module according to claim 1, wherein the blade conductor comprises a metal blade having a thickness between 50 and 500 µm and a width between 1 and 100 mm.

7. The photovoltaic module according to claim 1, wherein the external connector is a conducting wire connected in the insulating material to an external end of the blade conductor entering the insulating material, the insulating material being a polymer material.

8. The photovoltaic module according to claim 1, wherein the blade conductor is terminated by a first female part of a flat connector arranged between the first and second substrates outside the internal volume, the external connector being connected to the blade conductor by a pin forming a male part of the flat connector and terminated by a second female part integrated in an opening of the insulating material.

9. The photovoltaic module according to claim 1, wherein at least one L-shaped connector enters the insulating material, forming a right angle, and comprises an end arranged on the wall of a cylindrical opening of the external connector terminal, the at least one L-shaped connector connecting with the external connector inserted in the cylindrical opening.

10. The photovoltaic module according to claim 1, wherein the insulating material comprises an assembly of two glass substrates surrounding several conductors separated by glass blades, the assembly being bonded by a sealing glass.

11. The photovoltaic module according claim 1, wherein the blade conductor is terminated at an external end thereof, by a flexible part coming into contact with a contact zone arranged at the periphery of an opening of the insulating material and connected to the external connector inserted in the opening.

* * * * *